United States Patent
La Malfa et al.

(10) Patent No.: US 7,535,774 B2
(45) Date of Patent: May 19, 2009

(54) CIRCUIT FOR GENERATING AN INTERNAL ENABLING SIGNAL FOR AN OUTPUT BUFFER OF A MEMORY

(76) Inventors: Antonino La Malfa, Via S. Maria della Catena, 95, 95124 Catania (IT); Marco Messina, Contrada Monte Tauro, loc. Pergola, 96011 Augusta (IT)

( * ) Notice: Subject to any disclaimer, the term of this patent is extended or adjusted under 35 U.S.C. 154(b) by 297 days.

(21) Appl. No.: 11/337,030

(22) Filed: Jan. 20, 2006

(65) Prior Publication Data

US 2006/0181311 A1    Aug. 17, 2006

(30) Foreign Application Priority Data

Jan. 20, 2005  (IT)  .......................... VA2005A0002

(51) Int. Cl.
*G11C 7/10* (2006.01)
(52) U.S. Cl. ............................ 365/189.05; 365/189.15; 365/191; 365/196
(58) Field of Classification Search .................. 326/60, 326/80, 81, 82, 86, 87; 365/189.05, 189.15, 365/189.08, 189.11, 191, 206, 180.05, 196
See application file for complete search history.

(56) References Cited

U.S. PATENT DOCUMENTS

| | | | |
|---|---|---|---|
| 4,882,507 A * | 11/1989 | Tatsumi et al. ................. 326/28 |
| 5,303,191 A * | 4/1994 | Eagan et al. ................. 365/194 |
| 7,079,445 B2 * | 7/2006 | Choi et al. ................... 365/233 |

OTHER PUBLICATIONS

STMicroelectronics, "M68AW512M 8 Mbit (512K ×16) 3.0V Asynchronous SRAM," Sep. 2004, pp. 1-19.*

* cited by examiner

*Primary Examiner*—Anh Phung
*Assistant Examiner*—Alexander Sofocleous
(74) *Attorney, Agent, or Firm*—Schwabe, Williamson & Wyatt, P.C.

(57) ABSTRACT

A circuit is for generating an internal enabling signal for the output buffer of a memory as a function of external commands for enabling the memory and for outputting data. The circuit may be input with the external command for enabling the memory and with internally generated flags signaling when the memory is being read and when a read operation of data from the memory ends. The circuit may generate a first intermediate signal having a null logic value when the memory is enabled and the read operation of data from the memory ends. The circuit may further generate the internal enabling signal as a logic NOR between the first intermediate signal and a logic OR between the external command enabling the memory and the external command for outputting data.

27 Claims, 4 Drawing Sheets

CIRCUIT FOR GENERATING AN INTERNAL ENABLING SIGNAL FOR AN OUTPUT BUFFER OF A MEMORY

FIELD OF THE INVENTION

This invention relates to (nonvolatile) memory devices, and, more particularly, to a circuit that generates an internal enabling signal of an output buffer of a memory device when external commands for enabling the memory and outputting data are provided.

BACKGROUND OF THE INVENTION (Nonvolatile) Memory devices include output buffers of the type exemplified in FIG. 1a. They generate on a respective line of the bus DQ_PAD data read from the memory and made available on an internal bus DBUS. The internal signal OE ("Output Enable") for enabling an output buffer, or its inverted replica OEN generated by the dedicated circuit of FIG. 1b, disables the memory buffer and sets in a high impedance state the respective line DQ_PAD when the external enabling command CEN_PAD ("Chip Enable") is high, that is when the memory device is disabled.

When the memory is enabled, an output buffer transfers data from a line of the bus DBUS to the line of the bus DQ_PAD when a respective external enabling command OEN_PAD switches to the null logic value. Other circuits of the memory, not shown, send through the bus DBUS data read from the memory. This data is made available on the lines DQ_PAD after a time $t_{ELQV}$, for instance of 60 ns, from the instant in which the memory has been enabled.

An output buffer transfers on the line DQ_PAD a signal present on the internal bus DBUS after a time tELQX shorter than the time tELQV. In a buffer of FIG. 1a, the time tELQX is determined by the turn on/off delays of the MOS transistor and it is typically on the order of 15 ns.

It is evident that a line DQ_PAD is needlessly occupied for a relatively long time with data that does not correspond to the data read from the memory because this is not yet available on the internal bus DBUS. It would be desirable to increase the time tELQX to make it close to the time tELQV such that the line DQ_PAD is occupied only when a stable signal, corresponding to the read data, is present on the internal bus DBUS. This would reduce power consumption and noise on the line DQ_PAD and would free it for other uses.

For instance, a device for writing in the memory and a device for reading from the memory could use the same line DQ_PAD in a time-sharing mode. It would be possible to exploit the waiting time for a reading operation as a "holdtime" of a writing operation, with evident advantages in terms of reduced hardware complexity and optimization of the read/write phases.

SUMMARY OF THE INVENTION

The invention relates to a circuit for generating an internal enabling signal of an output buffer of a memory that meets the above mentioned objective. It includes a logic circuit that generates the internal enabling signal when the memory is turned on and enabled for generating output data through appropriate external commands, and when the read operation of the data from the memory ends. To attain this objective, the logic circuit processes the internal flags that signal when a read operation is in progress and when it ends, generally available in any such memory device for switching on the internal enabling signal such that the output buffer is enabled as soon as the read operation ends.

BRIEF DESCRIPTION OF THE DRAWINGS

The invention will be described referring to the attached drawings, wherein.

DETAILED DESCRIPTION OF THE PREFERRED EMBODIMENTS

Figure 1A:
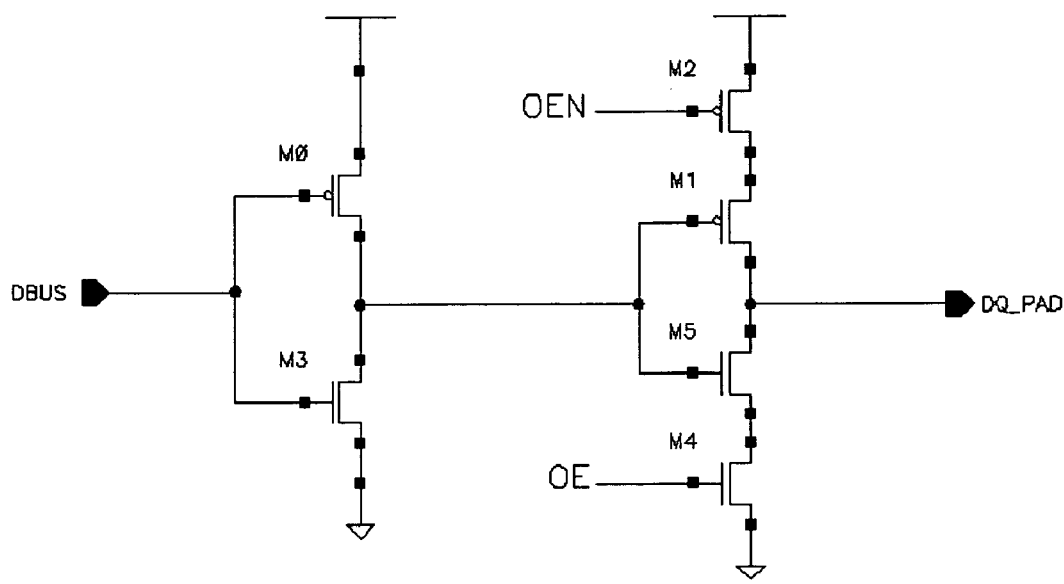
FIGS. 1a and 1b show an output buffer of a memory and a circuit for generating an internal enabling signal, respectively, as in the prior art.
Figure 1B:
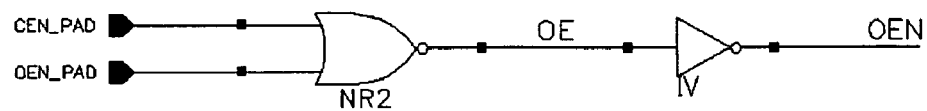
Figure 2:
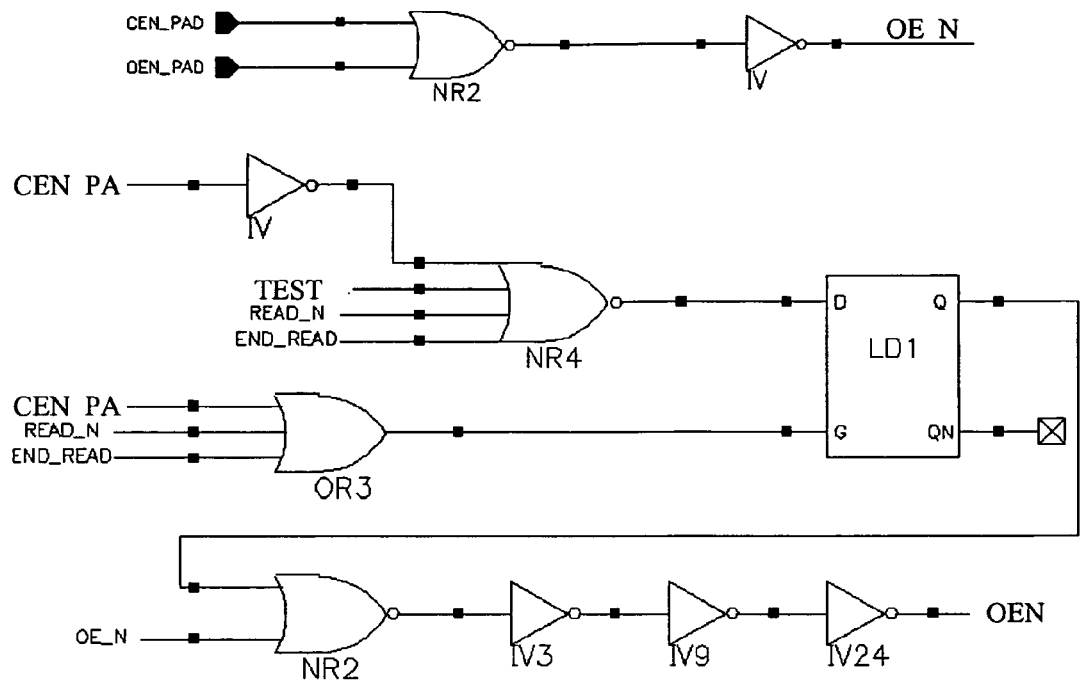
FIG. 2 shows a circuit of this invention for generating an internal enabling signal.

A first embodiment of the circuit of the invention is shown in FIG. 2. It has two logic gates NR2 and IV, like the known circuit of FIG. 1, and in addition it has a logic circuit that generates the internal output enable signal OEN as a function of the internal flags READ_N and END_READ that signal that a read operation is in progress and is terminated, respectively.

When the external commands CEN_PAD and OEN_PAD switch low, the signal OE_N is low but the internal enabling signal OEN does not yet switch low. As a consequence, the output buffer remains disabled even if the external commands enable the memory and the generation of output data as long as an intermediate signal Q assumes a logic low value.

This intermediate signal Q is generated by the latch LD1 as a replica of its input D when a high logic signal is fed to the input G. This takes place either when: a read operation of data from the memory is terminated, that is when the signal END_READ is high, or the internal registers of the memory are being read, that is when the signal READ_N is high.

The latter operation is much faster than a normal reading of data from the memory array (it lasts only a few ns, while reading a memory array cell takes normally about 50 ns). Thus, even if the signal OEN switches low before a reading operation of these registers ends, the output buffer does not hold the line DQ_PAD because of switching delays of the MOS transistors that compose it, before the signal on the bus DBUS becomes stable. With these expedients, the internal signal OEN enables the output buffer when the read operation from the memory is terminated, thus the line DQ_PAD is occupied only when the signal present on the bus DBUS is stable and corresponds to read data.

As an option, the state of the signal OEN may be conditioned even by a TEST flag, that signals when the memory device is in test mode, such as to enable the output buffer when a memory test is in progress.

Figure 3:
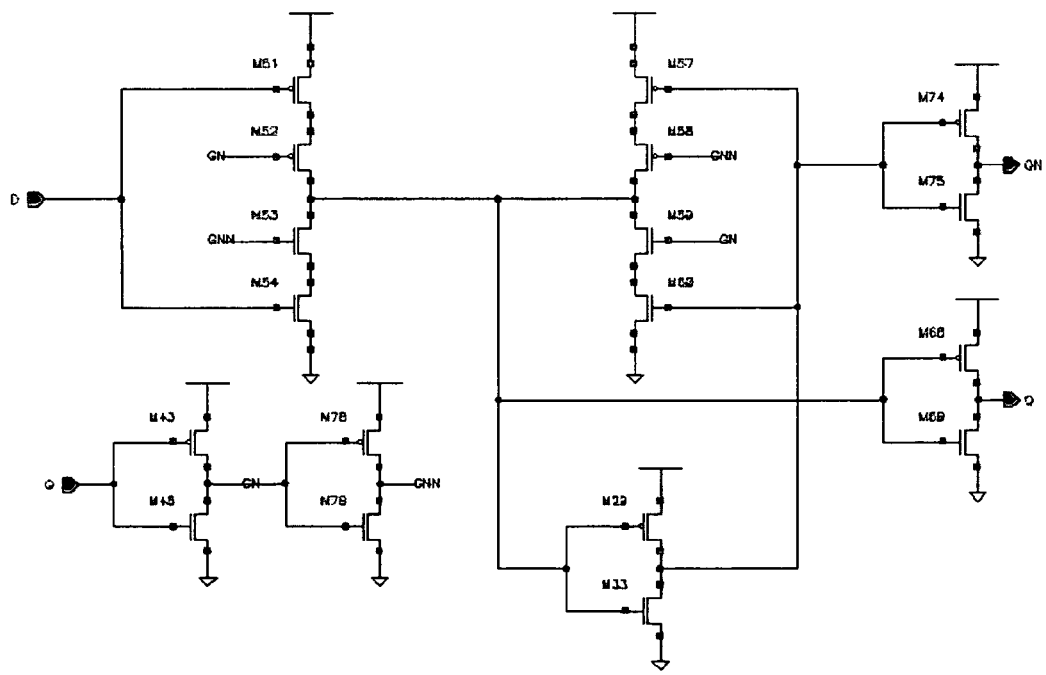
FIG. 3 shows an embodiment of the latch LD1 depicted in FIG. 2.

A detailed circuit scheme of the latch LD1 is shown in FIG. 3.

Figure 4:
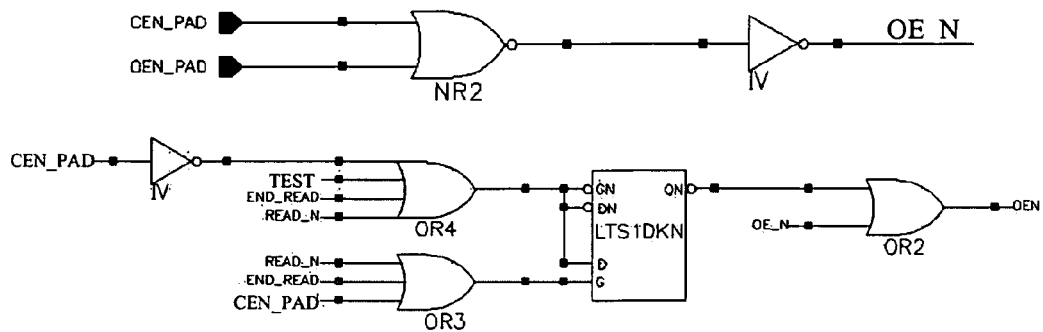
FIG. 4 shows a second embodiment of the circuit of this invention for generating an internal enabling signal.
Figure 5:
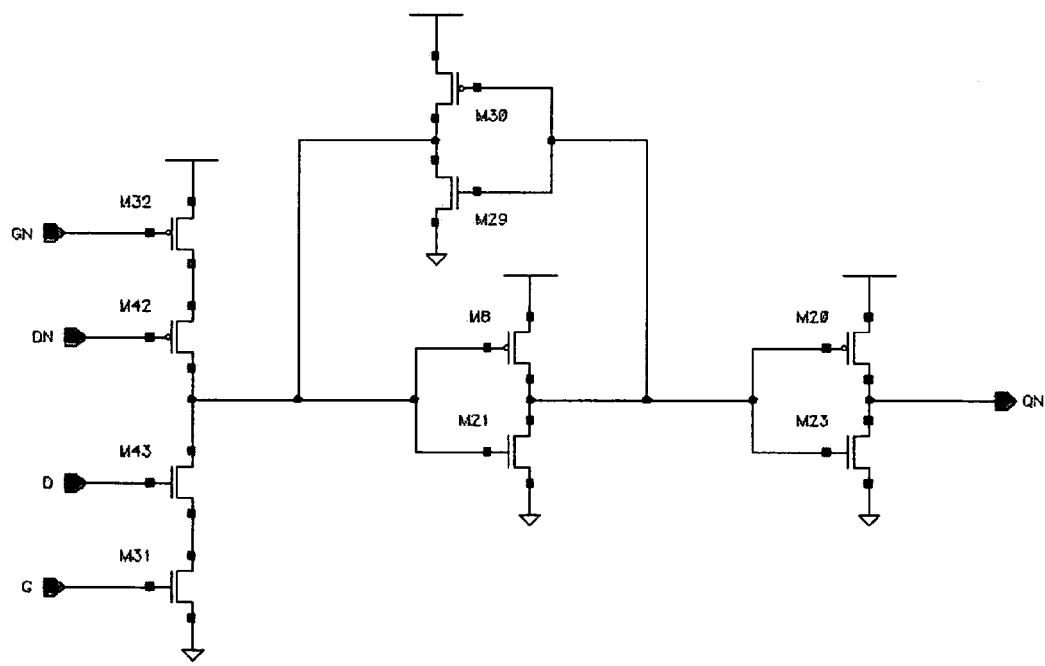
FIG. 5 shows an embodiment of the latch LTS1DKN of FIG. 2.

An alternative embodiment of the circuit of this invention is shown in FIG. 4. The working principle is similar to that of the circuit of FIG. 2, though the signal QN is generated by the latch LTS1DKN, the structure of which is shown in FIG. 5, fulfilling the following rules: if the output of the logic gate OR4 is low, the signal QN is high; if the output of the logic gate OR4 is high, then if the input G is high, the signal QN is null, if the input G is null the signal QN remains unchanged.

Figure 6:
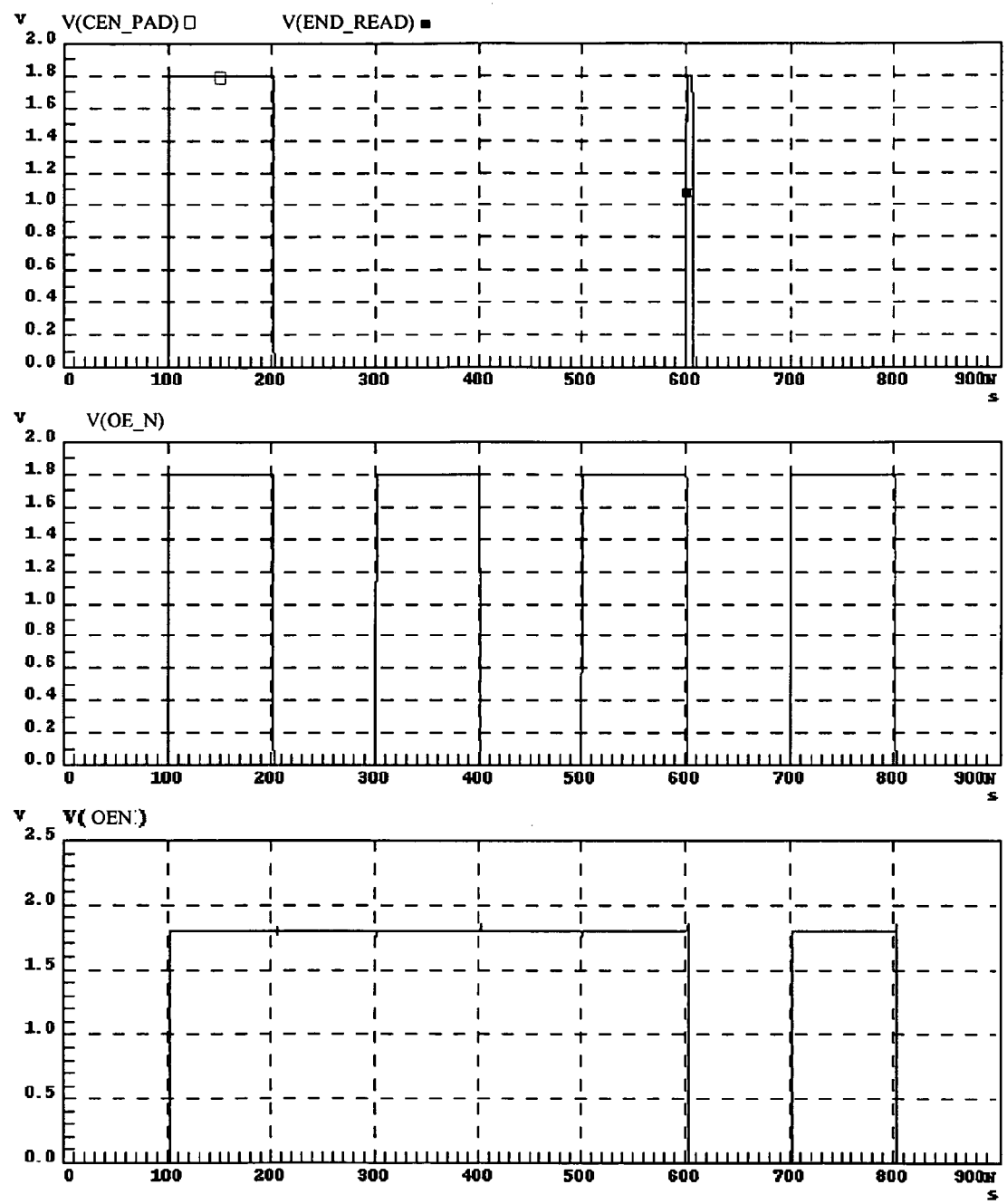
FIG. 6 shows possible waveforms of the main signals of the circuit of FIG. 2.

The diagram of FIG. 6 shows sample waveforms of the main signals of the circuit of FIG. 2. The signal OEN is such as to keep in a high impedance state the line DQ_PAD as far as the end of a reading operation of data is signaled by the flag END_READ, even if both the external command CEN_PAD and the signal OE_N are low.

That which is claimed is:

1. A memory comprising:
   an output buffer; and
   a logic circuit configured to
      receive one or more external commands to enable the memory and output data;
      receive one or more internally generated flags to signal when the memory is being read and when a read operation of data from the memory ends;
      generate a first intermediate signal with a null logic value when the memory is enabled and the read operation of data from the memory ends; and
      generate an internal enabling signal for said output buffer as a function of a logic NOR between the first intermediate signal and a logic OR between the external command to enable the memory and the external command to output data.

2. The memory according to claim 1, wherein said logic circuit comprises a logic NOR gate configured to
   receive an inverted replica of of an external command, of the one or more external commands, to enable the memory, and the one or more internally generated flags to signal when the memory is being read and when the read operation ends; and
   to generate a second intermediate signal.

3. The memory according to claim 2, wherein said logic NOR gate is configured to receive a signal to enable a test function of the memory.

4. The memory according to claim 2, wherein said logic circuit further comprises a latch configured to generate the first intermediate signal by being configured to sample the second intermediate signal based upon a sampling pulse signal.

5. The memory according to claim 4, wherein said logic circuit further comprises a logic OR gate configured to
   receive an external command, of the one or more external commands, to enable the memory, the one or more internally generated flags to signal when the memory is being read and when a read operation ends; and
   to generate the sampling pulse signal.

6. The memory according to claim 1, wherein said logic circuit comprises a logic OR gate configured to
   receive an inverted replica of an external command, of the one or more external commands, to enable the memory, the one or more internally generated flags to signal when the memory is being read and when the read operation ends; and
   generate a second intermediate signal.

7. The memory according to claim 6, wherein said logic OR gate is configured to receive a signal to enable a test function of the memory.

8. The memory according to claim 6, wherein said logic circuit further comprises a logic OR gate configured to
   receive the external command to enable the memory, the one or more internally generated flags to signal when the memory is being read and when the read operation ends, and
   generate an auxiliary signal.

9. The memory according to claim 8, wherein said logic circuit further comprises
   a latch to generate the first intermediate signal with a high logic value if the second intermediate signal is null, or with a null logic value if the second intermediate signal is high and the auxiliary signal is high; and wherein said latch is configured to leave unchanged the first intermediate signal when the second intermediate signal is high and the auxiliary signal is null.

10. A memory comprising:
    an output buffer; and
    a logic circuit configured to
       receive one or more external commands to enable the memory and output data;
       receive one or more internally generated flags to signal when the memory is being read and when a read operation of data from the memory ends;
       generated a first intermediate signal with a first logic value when the memory is enabled and the read operation of data from the memory ends; and
       generate an internal enabling signal for said output buffer as a function of
    a logic function between the first intermediate signal and a result of a logic function between the external command to enable the memory and the external command to output data.

11. The memory according to claim 10, wherein said logic circuit comprises a logic NOR gate configured to
    receive an inverted replica of an external command, of the one or more external commands, to enable the memory, and the one or more internally generated flags to signal when the memory is being read and when the read operation ends; and
    generate a second intermediate signal.

12. The memory according to claim 11, wherein said logic NOR gate is configured to receive a signal to enable a test function of the memory.

13. The memory according to claim 11, wherein said logic circuit further comprises a latch configured to generate the first intermediate signal by being configured to sample the second intermediate signal based upon a sampling pulse signal.

14. The memory according to claim 13, wherein said logic circuit further comprises a logic OR gate configured to
    receive the external command to enable the memory, and the one or more internally generated flags to signal when the memory is being read and when a read operation ends; and
    generate the sampling pulse signal.

15. The memory according to claim 10, wherein said logic circuit comprises a logic OR gate configured to
    receive an inverted replica of an external command, of the one or more external commands, to enable the memory, and the one or more internally generated flags to signal when the memory is being read and when the read operation ends; and
    generate a second intermediate signal.

16. The memory according to claim 15, wherein said logic OR gate is configured to receive a signal to enable a test function of the memory.

17. The memory according to claim 15, wherein said logic circuit further comprises a logic OR gate configured
    receive the external command to enable the memory, and the one or more internally generated flags to signal when the memory is being read and when the read operation ends; and
    generate an auxiliary signal.

18. The memory according to claim 17, wherein said logic circuit further comprises a latch configured to generate the first intermediate signal with a high logic value if the second intermediate signal is null, or with a null logic value if the second intermediate signal is high and the auxiliary signal is high; and wherein said latch is further configured to leave unchanged the first intermediate signal when the second intermediate signal is high and the auxiliary signal is null.

19. A method for generating an internal enabling signal for the output buffer of a memory as a function of external commands for enabling the memory and for outputting data comprising:
   inputting a logic circuit with the external command for enabling the memory and with internally generated flags signaling when the memory is being read and when a read operation of data from the memory ends;
   using the logic circuit to generate a first intermediate signal having a first logic value when the memory is enabled and the read operation of data from the memory ends; and
   using the logic circuit to generate the internal enabling signal as a logic function between the first intermediate signal and a result of a logic function between the external command enabling the memory and the external command for outputting data.

20. The method according to claim 19, wherein the logic circuit comprises a logic NOR gate input with an inverted replica of the external command for enabling the memory signal, and input with the flags signaling when the memory is being read and when the read operation ends, and generating a second intermediate signal.

21. The method according to claim 20, wherein the logic NOR gate is input with a signal for enabling a test function of the memory.

22. The method according to claim 20, wherein the logic circuit further comprises a latch generating the first intermediate signal by sampling the second intermediate signal based upon a sampling pulse signal.

23. The method according to claim 22, wherein the logic circuit further comprises a logic OR gate input with the external command for enabling the memory, the flags signaling when the memory is being read and when a read operation ends, and generating the sampling pulse signal.

24. The method according to claim 19, wherein the logic circuit comprises a logic OR gate input with an inverted replica of the external command for enabling the memory, the flags signaling when the memory is being read and when the read operation and, and generating a second intermediate signal.

25. The method according to claim 24, wherein the logic OR gate is input with a signal for enabling a test function of the memory.

26. The method according to claim 24, wherein the logic circuit further comprises a logic OR gate input with the external command for enabling the memory, the flags signaling when the memory is being read and when the read operation ends, and generating an auxiliary signal.

27. The method according to claim 26, wherein the logic circuit further comprises a latch generating the first intermediate signal having a high logic value if the second intermediate signal is null, or having a null logic value if the second intermediate signal is high and the auxiliary signal is high; and wherein the latch leaves unchanged the first intermediate signal when the second intermediate signal is high and the auxiliary signal is null.

* * * * *